US005912526A

United States Patent [19]

Okawa et al.

[11] Patent Number: 5,912,526

[45] Date of Patent: Jun. 15, 1999

[54] LAYERED-TYPE PIEZOELECTRIC ELEMENT AND METHOD FOR PRODUCING THE LAYERED-TYPE PIEZOELECTRIC ELEMENT

[75] Inventors: Yasuo Okawa, Nagoya; Yasuji Chikaoka, Aichi-ken; Atsuo Sakaida, Gifu; Yoshihumi Suzuki, Ena; Yoshiyuki Ikezaki, Nagoya, all of Japan

[73] Assignee: Brother Kogyo Kabushiki Kaisha, Nagoya, Japan

[21] Appl. No.: 08/579,159

[22] Filed: Dec. 27, 1995

[30] Foreign Application Priority Data

Jan. 12, 1995 [JP] Japan .................................... 7-003090

[51] Int. Cl.[6] ..................................................... H01L 41/08

[52] U.S. Cl. .......................... 310/328; 310/332; 310/366; 347/72

[58] Field of Search .................................... 310/328–332, 310/366–368, 358, 359; 347/68–72

[56] References Cited

U.S. PATENT DOCUMENTS

| | | | |
|---|---|---|---|
| 4,072,959 | 2/1978 | Elmqvist | 346/140 R |
| 4,409,601 | 10/1983 | Nilsson | 346/140 R |
| 4,456,394 | 6/1984 | Kolm et al. | 310/332 X |
| 4,633,121 | 12/1986 | Ogawa et al. | 310/332 |
| 4,766,671 | 8/1988 | Utsumi et al. | 427/97 |
| 5,153,477 | 10/1992 | Jomura et al. | 310/328 |
| 5,227,813 | 7/1993 | Pies et al. | 310/333 X |
| 5,245,244 | 9/1993 | Takahashi | 310/328 |
| 5,402,159 | 3/1995 | Takahashi et al. | 347/9 |
| 5,639,508 | 6/1997 | Okawa et al. | 310/328 X |
| 5,729,264 | 3/1998 | Pankert et al. | 347/71 |

FOREIGN PATENT DOCUMENTS

| | | |
|---|---|---|
| 402171-A2 | 12/1990 | European Pat. Off. . |
| 516188-A1 | 12/1992 | European Pat. Off. . |
| 616891-A1 | 9/1994 | European Pat. Off. . |
| 630748-A2 | 12/1994 | European Pat. Off. . |
| A-6-79871 | 3/1994 | Japan . |

*Primary Examiner*—Mark O. Budd
*Attorney, Agent, or Firm*—Oliff & Berridge, PLC

[57] ABSTRACT

A stacked body is formed from alternating piezoelectric ceramic layers 40 and internal electrode layers 42, 44. At least a central portion of a stacked body is divided into a plurality of actuator portions 46*a,* 46*b*, and 46*c* by elongated holes 52 opened in the stacked direction. The portions are supported at their end portions by a piezoelectric non-active portion 48. Desired actuator portions can be driven independently by selectively applying voltage to the electrodes corresponding to the actuator portions 46*a,* 46*b*, and 46*c*.

5 Claims, 5 Drawing Sheets

LAYERED-TYPE PIEZOELECTRIC ELEMENT AND METHOD FOR PRODUCING THE LAYERED-TYPE PIEZOELECTRIC ELEMENT

BACKGROUND OF THE INVENTION

1. Field of the Invention

The present invention relates to a layered-type piezoelectric element provided in an ink jet print head which ejects ink droplets to produce diagrams or characters by dots on a print medium and to a method for producing the layered-type piezoelectric element.

2. Description of the Related Art

Conventionally, there has been know an ink jet print head including piezoelectric elements. Each piezoelectric element either forms or is attached to a wall surface defining an ink reservoir or ink channel. When one of the piezoelectric elements is applied with a voltage, the piezoelectric element deforms, causing a displacement which changes the volume of the corresponding ink channel. Increase in pressure accompanying the volume change ejects an ink droplet from a nozzle fluidly connected with the ink channel.

Japanese Patent Application (Kokai) No. HEI-6-79871 discloses a configuration typical for such an ink jet print head. As shown in FIG. 1, vertically-displacing pillar-shaped piezoelectric ceramic elements 81 serving as layered-type actuators are formed from a block-shaped cintered body into which elongated grooves have been opened with a slicer or other instrument. The piezoelectric ceramic elements 81 are configured from stacks of thin piezoelectric element sheets alternating with thin internal electrodes. This configuration allows low voltage drive of the piezoelectric ceramic elements 81. The internal electrodes are exposed in alternation at opposing side surfaces of the piezoelectric ceramic elements 81. The internal electrodes are connected, by wire bonding or by other means, to a drive power source for supplying a voltage for driving the piezoelectric ceramic elements 81.

An elastic thin plate 82 is adhered to the tip ends of the pillar-shaped piezoelectric ceramic elements 81. Further, a nozzle plate 84 made from resin and formed with ink channels 83 and nozzles 83*a* is adhered to the thin plate 82 so that tip ends of the piezoelectric ceramic elements 81 are positioned over corresponding ink channels 83. Application of a voltage to the piezoelectric ceramic elements 81 produces displacement which deforms the thin plate 82 and ejects ink in the ink channel 83 from the nozzles 83*a*. Dot-pattern characters and other images can therefore be printed.

However, the pillar-shaped piezoelectric ceramic elements 81 of the ink jet print head shown in FIG. 7 easily break because they are thin independent units. Because the pillar-shaped piezoelectric ceramic elements 81 break easily, production yield of the ink jet print head is low. Also, the ink jet print head is unreliable because the pillar-shaped piezoelectric ceramic elements 81 can easily break when driven.

Also, producing the piezoelectric ceramic elements 81 requires many production processes such as machining the pillar-shaped piezoelectric element using a slicer and such as wire bonding for the power supply. The great number of production processes makes the piezoelectric ceramic elements 81 expensive to produce.

SUMMARY OF THE INVENTION

The object of the present invention is to solve the above-described problems and to provide a reliable and inexpensive to produce layered-type piezoelectric element used in an ink jet print head and to provide a high yield method for producing the layered-type piezoelectric element.

To achieve the above-described objectives, a layered-type piezoelectric element according to one aspect of the present invention is for producing a pressure fluctuation within a cavity of an ink jet print head to eject the ink from the cavity. The layered-type piezoelectric element comprises: piezoelectric ceramic layers; and internal electrode layers stacked in a stacked direction alternately with the piezoelectric ceramic layers to form a stacked body, the internal electrode layers including an odd-numbered electrode layer group and an even-numbered electrode layer group; wherein elongated holes are opened through at least a central portion of the stacked body in the stacked direction, the elongated holes defining a plurality of actuator portions in the stacked body, portions of each layer of the odd-numbered electrode layer group being in opposition in the stacked direction with portions of each layer of the even-numbered electrode layer group at least at the actuator portions of the stacked body.

Also, at least one group of the odd-numbered electrode layer group and the even-numbered electrode layer group includes a plurality of electrically isolated electrodes disposed at positions corresponding to the actuator portions.

According to another aspect of the present invention, a method for making a layered-type piezoelectric element for producing a pressure fluctuation within a cavity of an ink jet print head to eject ink from the cavity includes the following steps in the order named: producing from a piezoelectric material a plurality of first and second plate sheets each having elongated holes at a predetermined pitch; forming a first electrode on each of the first plate sheets so that a terminal of each of the first electrodes is exposed on an edge of its corresponding first plate sheet; forming a second electrode on each of the second plate sheets so that a plurality of terminals of each of the second electrodes are exposed on an edge of its corresponding second plate sheet; stacking the first and second sheets in alternation to form a stacked body; and attaching the first and second sheets together by pressing them together.

According to a further aspect of the present invention, a method for making a layered-type piezoelectric element for producing a pressure fluctuation within a cavity of an ink jet print head to eject the ink from the cavity includes the following steps in the order named: forming a first electrode on each of a group of first plate sheets made from piezoelectric material, each first electrode being formed so that a terminal thereof is exposed on an edge of its corresponding first plate sheet; forming a second electrode on each of a group of second plate sheets made from piezoelectric material, each second electrode being formed so that a plurality of terminals thereof are exposed on an edge of its corresponding second plate sheet; forming elongated holes to a predetermined pitch on each of the first and second plate sheets; stacking the first and second plate sheets in alternation to form a stacked body; and pressing the stacked body to attach the first and second plate sheets together.

According to a further aspect of the present invention, a method for making a layered-type piezoelectric element for producing a pressure fluctuation within a cavity of an ink jet print head to eject ink from the cavity, includes the following steps in the order named: forming a first electrode on each of a group of first plate sheets made from piezoelectric material, each first electrode being formed so that a terminal thereof is exposed on an edge of its corresponding first plate sheet; forming a second electrode on each of a group of second plate sheets made from piezoelectric material, each second electrode being formed so that a plurality of terminals thereof are exposed on an edge of its corresponding second plate sheet; stacking the first and second plates sheets to form a stacked body; pressing the stacked body to attach the first and second plates sheets together; and forming elongated holes through the stacked body in a stacked direction in which the plate sheets are stacked and at a predetermined pitch in a direction normal to the stacked direction.

According to a further aspect of the present invention, a print head array comprises: a nozzle plate formed with nozzles; an ink channel plate attached to the nozzle plate, the ink channel plate formed with ink channels having a predetermined size, the ink channels aligned with the nozzles; and a stacked body for producing a pressure fluctuation in the ink channels to eject ink from the nozzles, the stacked body including: piezoelectric ceramic layers; and internal electrode layers stacked in a stacked direction alternately with the piezoelectric ceramic layers, the internal electrode layers including an odd-numbered electrode layer group and an even-numbered electrode layer group; wherein the stacked body is formed through at least a central portion thereof with elongated holes opened in the stacked direction, the elongated holes defining a plurality of actuator portions for producing the pressure fluctuation in the ink chambers, the actuator portions being aligned with the ink chambers and having a predetermined size smaller than the predetermined size of the ink chambers, portions of each layer of the odd-numbered electrode layer group being in opposition in the stacked direction with portions of each layer of the even-numbered electrode layer group at least at the actuator portions of the stacked body, at least one group of the odd-numbered electrode layer group and the even-numbered electrode layer group including a plurality of electrically isolated electrodes disposed at positions corresponding to the actuator portions.

BRIEF DESCRIPTION OF THE DRAWINGS

The above and other objects, features and advantages of the invention will become more apparent from reading the following description of the preferred embodiment taken in connection with the accompanying drawings in which.

DETAILED DESCRIPTION OF THE PREFERRED EMBODIMENT

Figure 1:
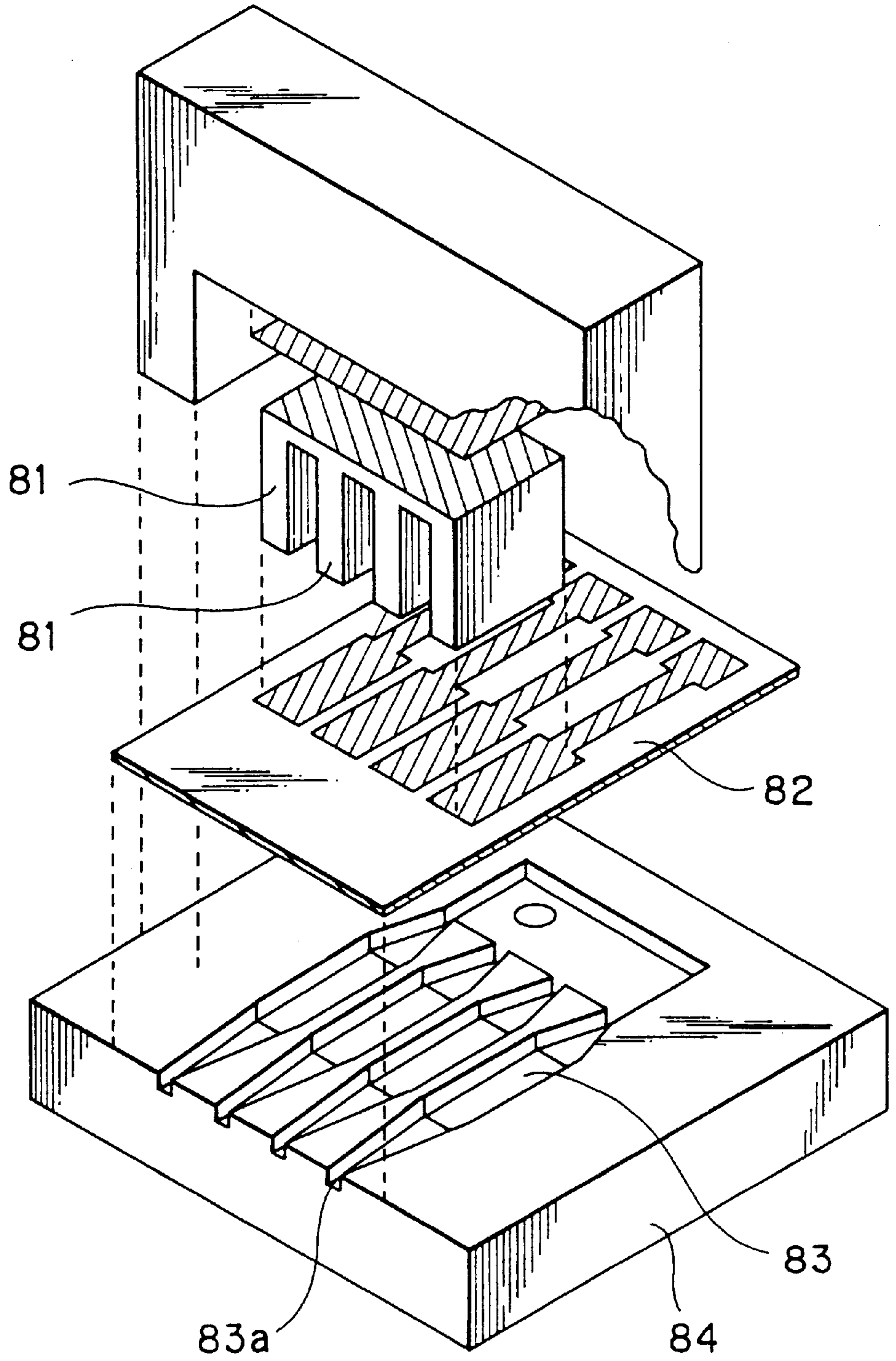
FIG. 1 is a sectional perspective view showing a conventional ink jet print head.

A layered-type piezoelectric element and a method of producing the layered-type piezoelectric element according to a preferred embodiment of the present invention will be described while referring to the accompanying drawings wherein like parts and components are designated by the same reference numerals to avoid duplicating description.

Figure 2:
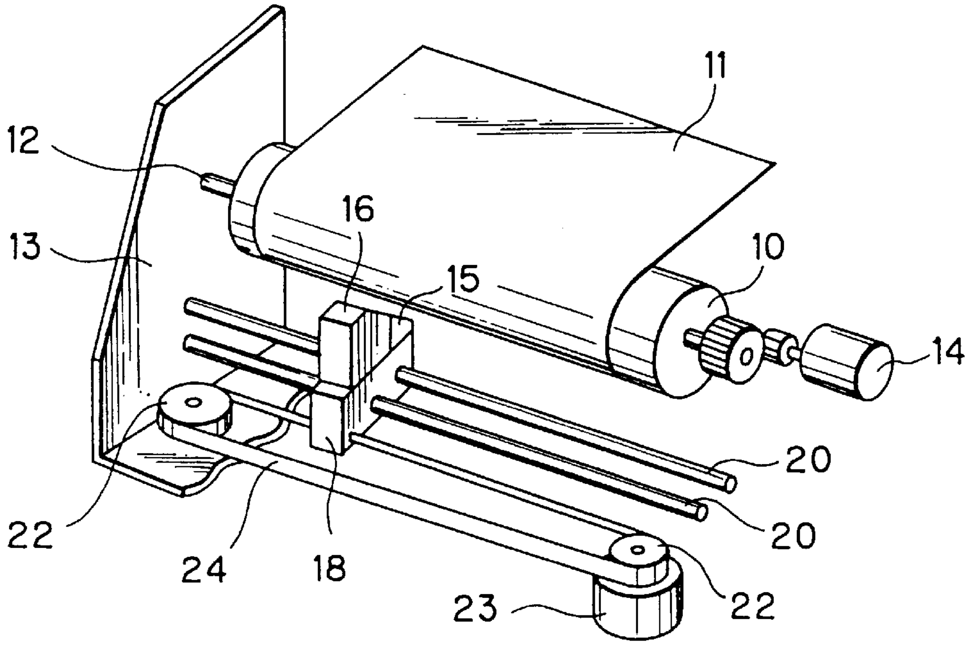
FIG. 2 is a perspective view showing essential portions of an ink jet printer incorporating an ink jet print head according to the present invention.

FIG. 2 shows essential portions of an ink jet printer to which an ink jet print head 15 according to the embodiment of the present invention is mounted. A platen 10 for feeding a sheet 11 is rotatably mounted to a frame 13 by a shaft 12. A motor 14 is provided for driving the platen 10. Two guide rods 20 are also mounted to the frame 13 in parallel to the axis of the platen 10. A carriage 18 is slidably supported on the two guide rods 20. An ink jet print head 15 and an ink supplier 16 are mounted on the carriage 18 so as to face the platen 10. A timing belt 24 wound on a pair of pulleys 22 is fixed to the carriage 18. A motor 23 is provided for rotating one of the pulleys 22. Feed of the timing belt 24 moves the carriage 18 in alignment with the platen 10.

Figure 3:
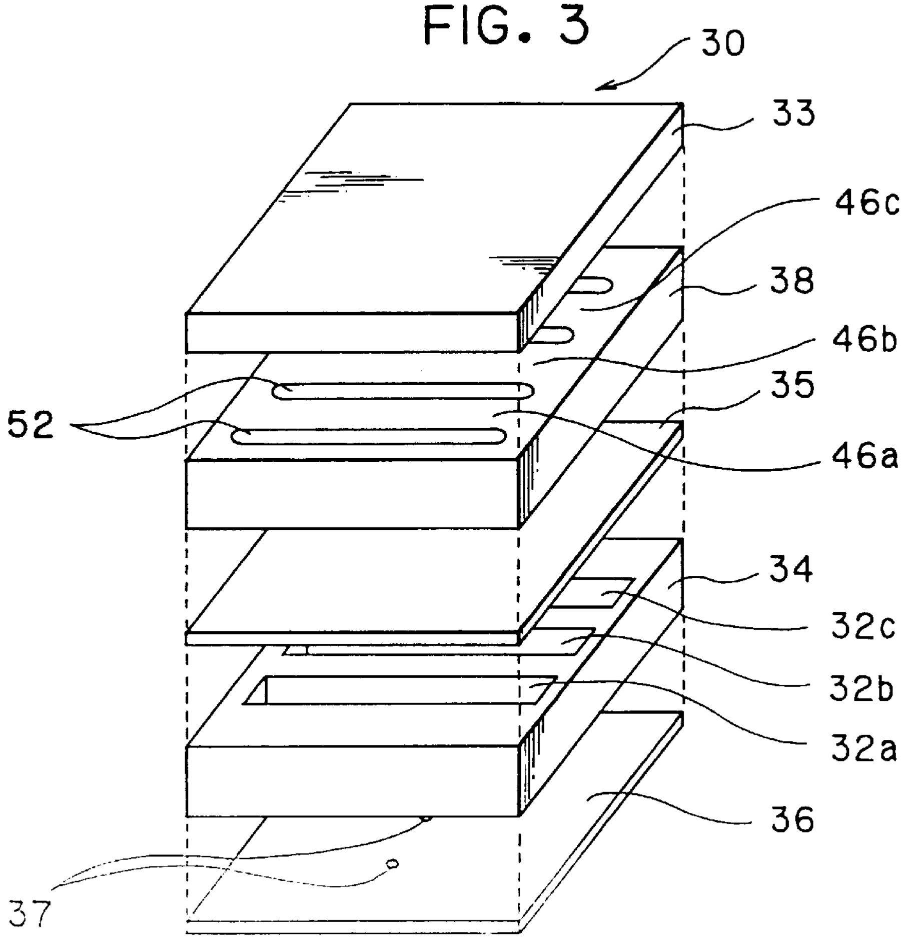
FIG. 3 is an exploded view showing an array of the ink jet print head.

FIG. 3 is an exploded perspective view showing an array 30 used in the ink jet print head 15. The array 30 includes a base plate 33 made from a metal or a ceramic with a high modulus of elasticity, a layered-type piezoelectric element 38 according to the present invention, a thin-film vibration plate 35, a channel main body 34, and an orifice plate 36 formed with orifices 37. These components of the array 30 are attached together in the configuration shown in FIG. 3. That is, the base plate 33 is secured on one side of the layered-type piezoelectric element 38 and the thin-film vibration plate 35 is disposed to the other side of the layered-type piezoelectric element 38. The layered-type piezoelectric element 38 is attached, via the thin-film vibration plate 35, to one side of the channel main body 34 and the orifice plate 36 is attached to the other of the channel main body 34. The channel main body 34 and the orifice plate 36 are formed by injection molding of a resin material.

The layered-type piezoelectric element 38 has formed therein a plurality of slit-shaped elongated holes 52 defining therebetween actuator portions **46*a*, 46*b*, and 46*c*. The channel main body 34 has formed therein ink channels 32*a*, 32*b*, and 32*c* extending in parallel with and at positions corresponding to the actuator portions 46*a*, 46*b*, and 46*c*. In the present embodiment, the ink channels 32*a*, 32*b*, and 32*c* are formed longer in the lengthwise direction and wider in the widthwise direction than corresponding actuator portions 46*a*, 46*b*, and 46*c* of the layered-type piezoelectric element 38**.

Figure 4:
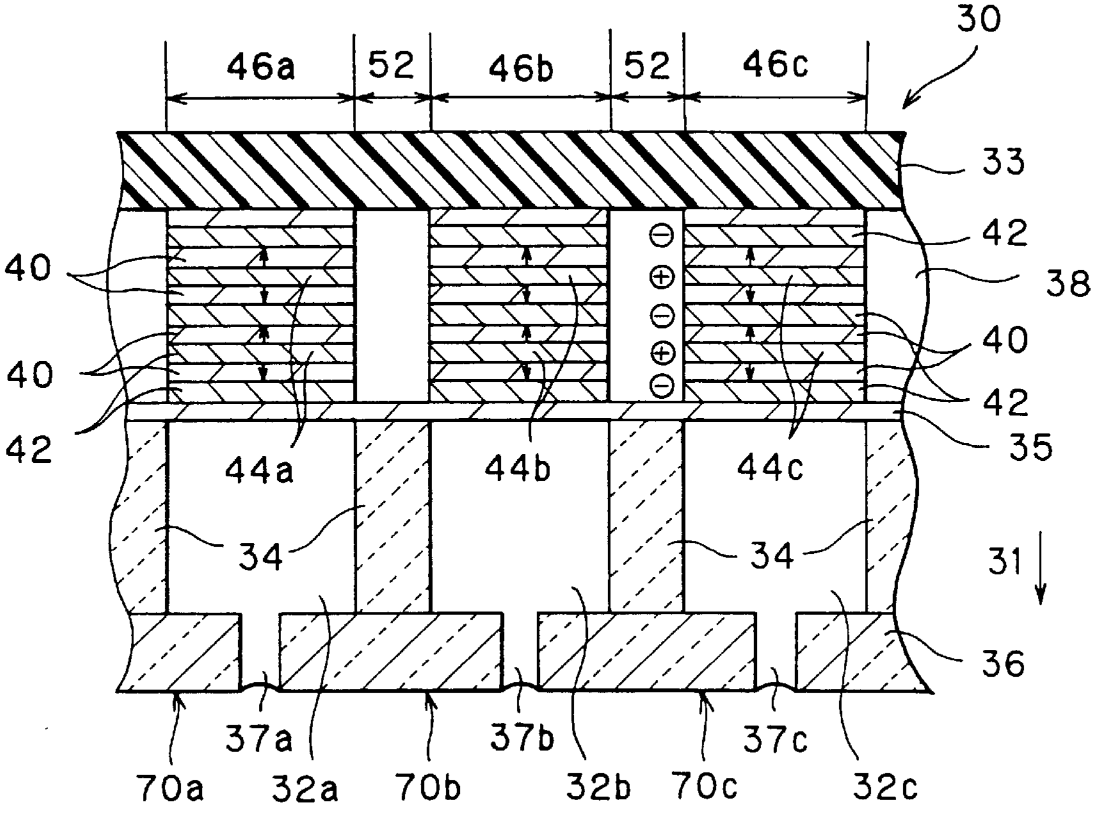
FIG. 4 is a sectional cross-sectional view showing the array.

As can be seen in FIG. 4, the array 30 of the present embodiment includes three ejection devices **70*a*, 70*b*, 70*c*, which include the actuator portions 46*a*, 46*b*, and 46*c* and the ink channels 32*a*, 32*b*, and 32*c* respectively. In other words, the actuator portions 46*a*, 46*b*, and 46*c* of the layered-type piezoelectric element 38 are positioned at cavities formed by the ink channels 32*a*, 32*b*, and 32*c* (which extend perpendicular to the sheet surface of FIG. 4) so that the layered-type piezoelectric element 38 serves as a piezoelectric actuator for the three ejection devices 70*a*, 70*b*, and 70*c***.

The layered-type piezoelectric element 38 is a multilayered stacked body including: piezoelectric ceramic layers 40 having piezoelectric and electrostrictive properties; internal negative electrode layers 42; and internal positive electrode layers **44*a*, 44*b*, and 44*c*. The piezoelectric ceramic layers 40 are composed of a lead zirconium titanate (PZT) ceramic material with ferroelectric properties. As indicated by arrows at the actuator portions 46*a*, 46*b*, and 46*c* in FIG. 4, the piezoelectric ceramic layers 40 are polarized in the direction in which they are stacked. The internal negative electrode layers 42 and internal positive electrode layers 44*a*, 44*b*, and 44*c*** are composed of a silver-palladium (Ag-Pd) metal material.

Figure 5:
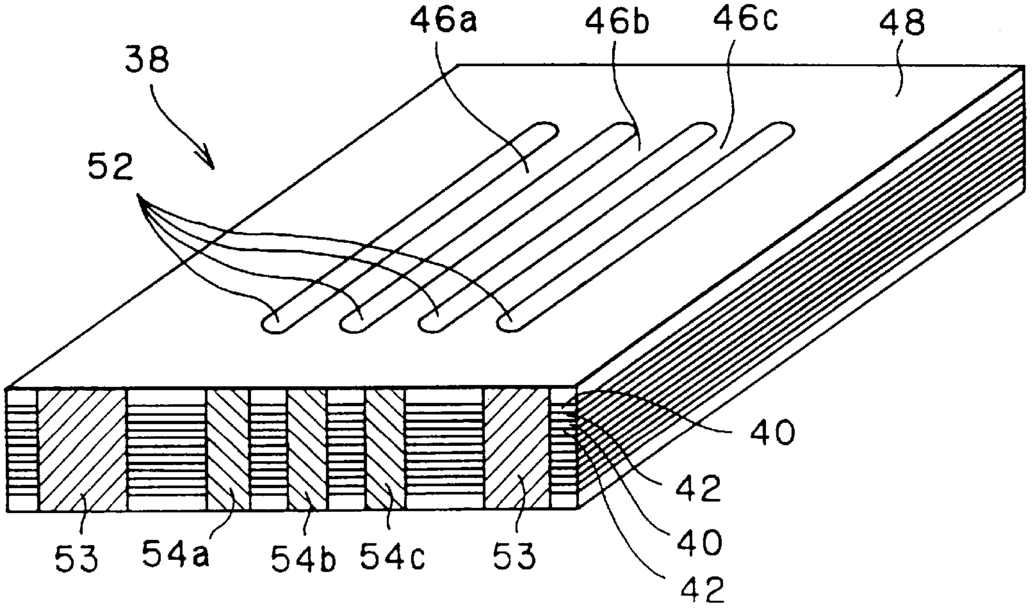
FIG. 5 is a perspective view showing a layered-type piezoelectric element according to the present invention.

As can be seen in FIG. 5, the actuator portions 46*a*, 46*b*, and 46*c* are formed at the central portion of the layered-type piezoelectric element 38 and are divided by the plurality of elongated holes 52. In addition to the actuator portions 46*a*, 46*b*, and 46*c*, the layered-type piezoelectric element 38 includes a piezoelectric inactive portion 48 at an edge portion thereof. The piezoelectric inactive portion 48 connects end portions of the actuator portions 46*a*, 46*b*, and 46*c* together.

Figure 6:
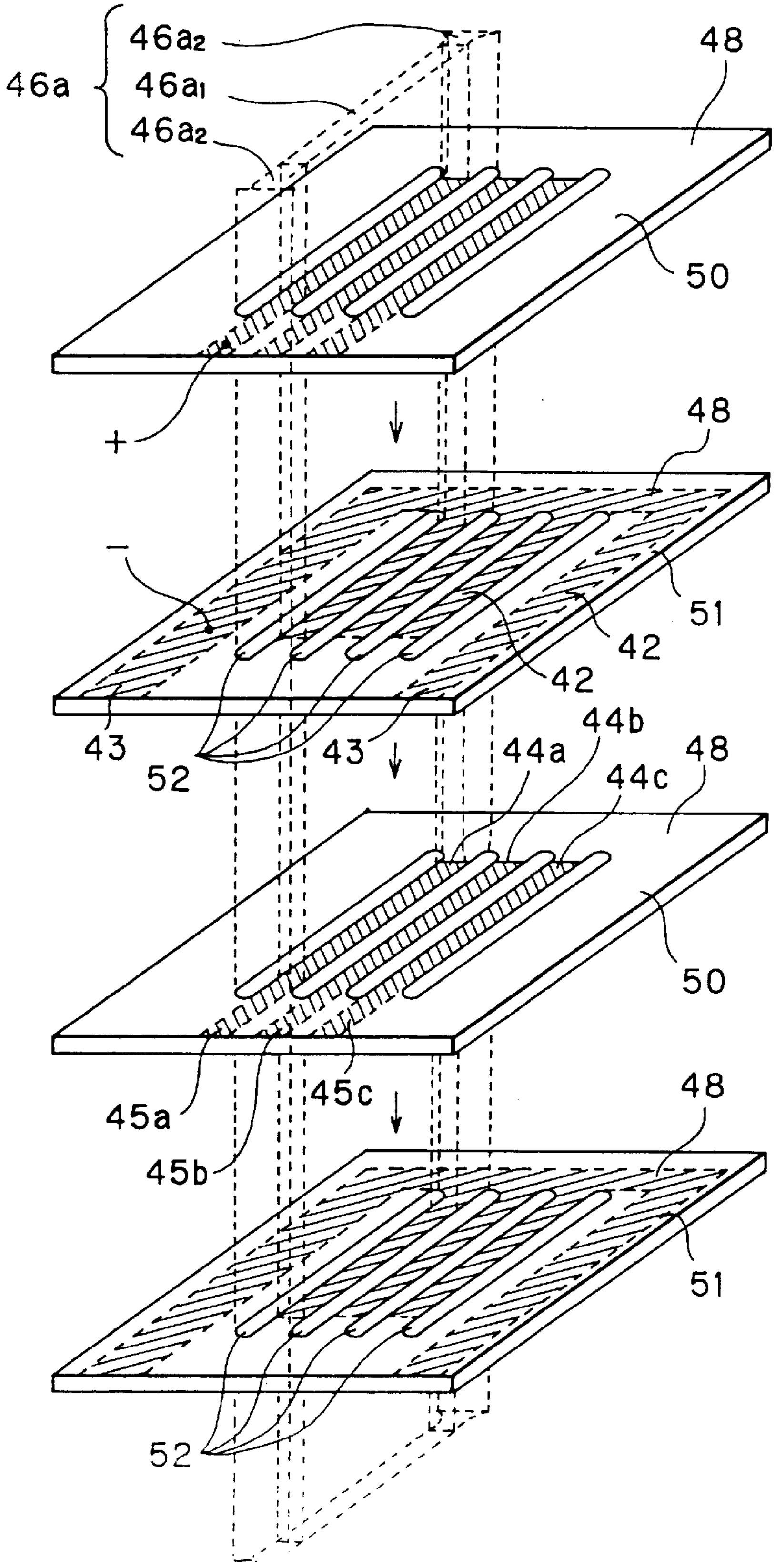
FIG. 6 is an exploded view of the layered-type piezoelectric element.

As shown in FIG. 6, the internal positive electrode layers 44*a*, 44*b*, and 44*c* are divided by the elongated holes 52 to a one-to-one correspondence with the ink channels 32*a*, 32*b*, and 32*c*. The internal electrode layers 42, and 44*a*, 44*b*, and 44*c* overlap at overlapping regions $46a_1$ (indicated by dotted lines in FIG. 6), $46b_1$, and $46c_1$, that is, at all areas between the elongated holes except the tips of each actuator portion 46*a*, 46*b*, and 46*c*. On the other hand, internal electrode layers 42, and 44*a*, 44*b*, and 44*c* do not overlap at the piezoelectric inactive portion 48 nor at non-overlapping regions $46a_2$ (indicated by dotted lines in FIG. 6), $46b_2$, and $46c_2$, that is, at the tips of each actuator portion 46*a*, 46*b*, and 46*c*.

The layered-type piezoelectric element 38 can be produced by the following method. A powder of a piezoelectric material, which is primarily PZT, is mixed to a desired composition. Then the powder is calcined at 850° C. Next, a defoaming agent, a minute quantity of a plastic material, and five parts by weight binder are added to the powder. The resultant mixture is dispersed in an organic solvent to produce a slurry. The slurry is formed into green sheet base plates with a predetermined thickness using a doctor blade. Window-shaped elongated holes 52 are punched into each of the base plates to predetermined dimensions.

Next, palladium (Pd) paste is then screen printed on the base plates to form green sheets 50 and 51 with the two different patterns of internal electrodes shown in FIG. 6. That is, internal positive electrode layers 44*a*, 44*b*, and 44*c*, whose number is a one-to-one correspondence with the number of the ink channels 32*a*, 32*b*, and 32*c*, are first formed by screen printing on the upper surface of each of one group of base plates. Then, electrode terminal portions 45*a*, 45*b*, and 45*c* of respective internal positive electrode layers 44*a*, 44*b*, and 44*c* are formed on the same base plates by screen printing to produce a group of green sheets 50. On the upper surface of the remainder of the base plates, an internal negative electrode layer 42 with electrode terminal portions 43 is formed traversing across all the ink channels 32*a*, 32*b*, and 32*c* by screen printing to produce green sheets 51.

It should be noted that the internal electrode layers 42, and 44*a*, 44*b*, and 44*c* are provided with their tip end portions drawn slightly back from the ends of the elongated holes 52 in the lengthwise direction of the elongated holes 52 to insure that, when the green sheets 50, 51 are stacked, the internal positive electrode layers 44 and the internal negative electrode layers 42 overlap each other in the stacked direction only at the overlapping regions $46a_1$, $46b_1$, and $46c_1$. Further, the electrode terminals 43, 45*a*, 45*b*, and 45*c* are formed so as to be exposed on corresponding side edges of the green sheets 50, 51.

Next, both types of green sheets 50, 51 are stacked alternately to a total of 10 sheets. On top is stacked a green sheet (not shown) with no internal electrode layer on the upper surface of its piezoelectric ceramic layer 40. The sheets are then heat-pressed into an integrated body. After degreasing, sintering is carried out at approximately 1,200° C., resulting in a stacked body made from piezoelectric elements. As shown in FIG. 5, outer negative electrodes 53 and outer positive electrodes 54*a*, 54*b*, 54*c* are attached to locations where the electrode terminal portions 43, 45*a*, 45*b*, and 45*c* are exposed in the thus-formed stacked body Then, a well-known polarization process is executed to polarize the stacked body by application of an electric field. The polarization process can be carried out, for example, by immersing the stacked body into an oil bath (not shown) filled with an electrically insulating oil, such as silicon oil, heated to about 130° C. An electric field of approximately 2.5 kV/mm is then applied between the outer negative electrodes 53 and the outer positive electrodes 54*a*, 54*b*, and 54*c* to polarize the stacked body. If the piezoelectric ceramic layers 40 of the stacked body are sufficiently thin, for example, approximately 50 μm, they can be easily polarized without providing a special environment such as the oil bath. In this case, a voltage of approximately 30 V is applied between the outer negative electrodes 53 and the outer positive electrodes 54*a*, 54*b*, and 54*c* after the ink jet print head 15 has been assembled.

The layered-type piezoelectric element 38 shown in FIG. 5 can be obtained using the above-described method. The elongated holes 52 can be formed simply by a cutting or punching out process. It should be noted that the process described above for making the layered-type piezoelectric element 38 can be performed without any punching processes. For example, a green sheet base plate having elongated holes 52 with predetermined dimensions can be produced by performing injection molding techniques using molding materials made from piezoelectric material. None of the above-described methods, that is, whether the elongated holes 52 are formed by a punching out, cutting process, or by injection molding, require any special processing equipment or production processes. Therefore, production can be easily managed and these methods are well suited for mass production techniques.

As a variation of the method for producing the layered-type piezoelectric elements 38, the internal electrode layers 42, 44 and the electrode terminal portions 43, 45 may be formed on base plates before punching out or otherwise forming the elongated holes 52. In this case, the internal positive electrode layers 44*a*, 44*b*, and 44*c* need not be printed so that they are electrically isolated from each other. Instead, the conductive material need only be printed on the base plates so that opening the elongated holes 52 will divide the resultant layer of conductive material into an electrically isolated plurality of internal positive electrode layers 44*a*, 44*b*, and 44*c* whose number corresponds to the number of electrode terminal portions 45*a*, 45*b*, and 45*c*.

The material of the internal positive electrode layers 44*a*, 44*b*, and 44*c* can therefore be printed using a simpler process. Next, as in the above-described embodiment, green sheets 50 and green sheets 51 are stacked alternately, heat-pressed into an integrated body, degreased, and then sintered. Then, the outer electrodes 53, 54 are formed and the stacked body polarized to produce the layered-type piezoelectric element 38.

In still another variation of the method for making the layered-type piezoelectric element 38, elongated holes can be opened in green sheets after they are stacked together. In this case, first, green sheet base plates are molded to the predetermined thickness using a doctor blade or similar device. Then, without punching elongated holes 52 into the green sheet plates, internal negative electrode layers 42 and electrode terminal portions 43 are formed on one group of green sheet base plates. Internal positive electrode layers 44 and electrode terminal portions 45 are then formed on another group of green sheet base plates. Next, both types of green sheets are stacked alternately to a total of 10 sheets. Another green sheet (not shown), which will form a piezoelectric ceramic layer 40 with no internal electrode layer on its upper surface is stacked on top. The stack of green sheets are then heat-pressed into an integrated stacked body. Elongated holes are then formed at a predetermined pitch in the integrated stacked body by using a punching process. Next, as in the above-described embodiment, the stacked body with elongated holes opened therein undergoes degreasing and sintering. The layered-type piezoelectric element 38 is produced by attaching the outer electrodes 53, 54 and polarizing the stacked body.

This method also eliminates the need to screen print the internal positive electrode layers 44*a*, 44*b*, and 44*c* so that they are electrically isolated from each other. Instead, the material of the internal positive electrode layers 44*a*, 44*b*, and 44*c* can be printed by a simple process so that forming the elongated holes 52 will divide the resultant layer of conductive material into an electrically isolated plurality of internal positive electrode layers 44*a*, 44*b*, and 44*c*, whose number corresponds to the number of electrode terminal portions 45*a*, 45*b*, and 45*c*. In addition, in this example, the elongated holes are formed after the green sheets are assembled into a stacked and integrated body. Therefore, without aligning the elongated holes 52 when stacking the green sheets 50, 51 as is required in the above-described embodiment, a stacked body can be produced with edges of the actuator portions 46*a*, 46*b*, and 46*c* properly aligned even if the green sheets are shifted slightly out of alignment.

Further, in a slight variation to this last process, if the stacked body is thick, whether because it includes many layers of layered-type piezoelectric elements 38 or for some other reason, then the elongated holes 52 should not be opened in an integrated stacked body containing the ultimately desired number of stacked green sheets. Instead, thin integrated stacked bodies are first formed by stacking and heat pressing a few green sheets having the internal electrode layers and other components. Then elongated holes 52 are formed in each of the resultant thin integrated bodies to produce a plurality of thin stacked bodies with elongated holes 52 formed therein. Next, a number of the thin stacked bodies are stacked to obtain a thicker stacked body with the ultimately desired number of stacked layers. Afterward, the resultant thick stacked body is heat-pressed again into an integrated body and then degreased and sintered.

All of the layered-type piezoelectric elements 38 formed through the above-described methodes have actuator portions 46*a*, 46*b*, and 46*c* connected by their end portions to the piezoelectric non-active region 48. Therefore, even if the actuator portions 46*a*, 46*b*, and 46*c* are thin, they will be supported by the piezoelectric non-active region 48 and so will not break or be damaged during production.

Figure 7:
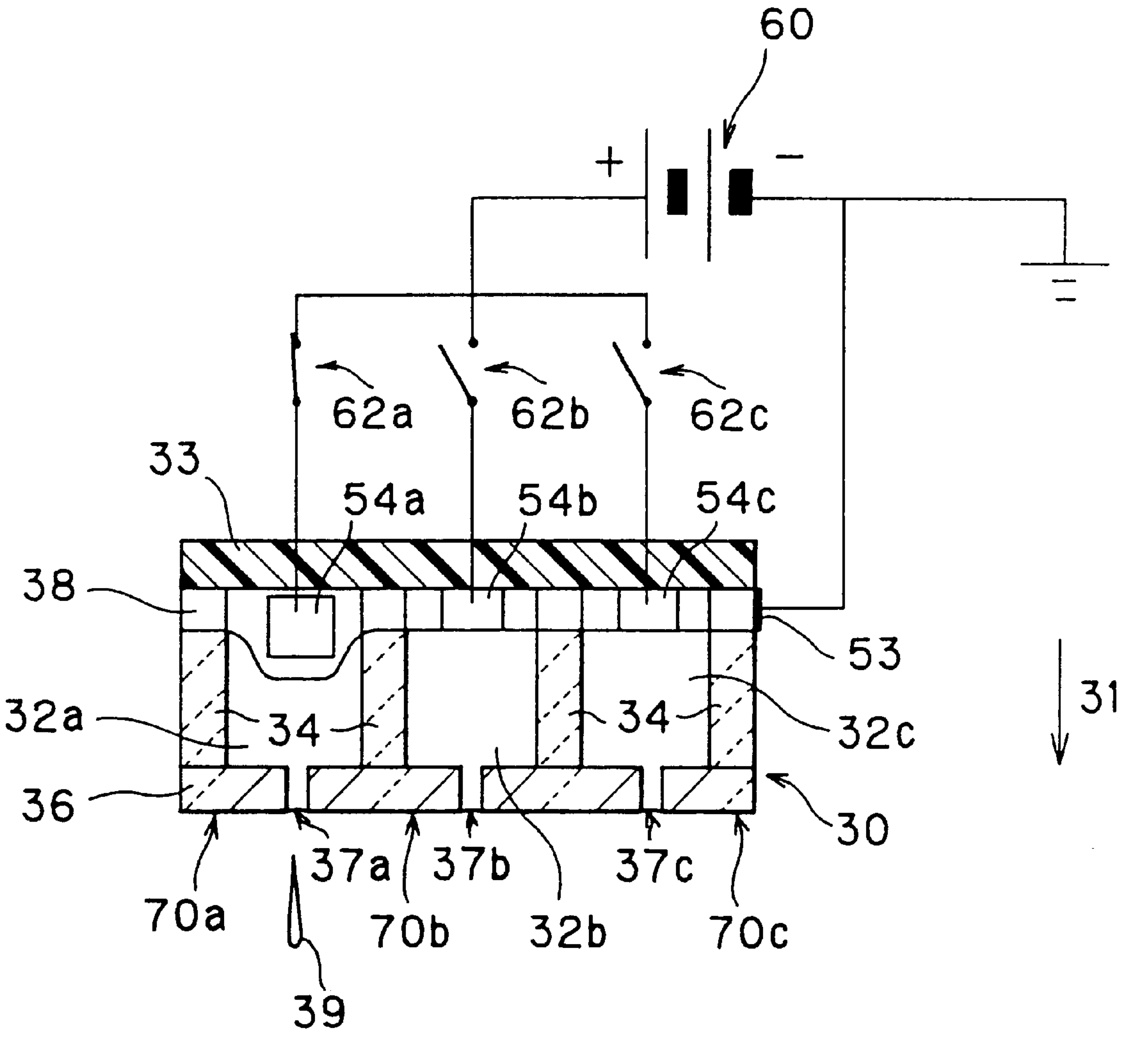
FIG. 7 is perspective view showing electric circuits provided for driving the array.

Electric circuits provided in the array 30 are shown in FIG. 7. The outer positive electrodes 54*a*, 54*b*, and 54*c* of the layered-type piezoelectric element 38 are connected to the positive electrode of a drive power source 60 through openable and closable switches 62*a*, 62*b*, 62*c*. The outer negative electrodes 53 of the layered-type piezoelectric element 38 and the negative electrode of the drive power source 60 are grounded. A controller (not shown) opens and closes the switches 62*a*, 62*b*, and 62*c* to selectively apply a driving voltage from the drive power source 60 between the internal negative electrode layers 42 and the internal positive electrode layers 44 located on a selected one of the actuator portions 46*a*, 46*b*, or 46*c*.

Next, the operation of an ink jet print head 15 having the above-described configuration will be described. For convenience of explanation, it will be assumed that the array 30 according to the present embodiment is provided with three ink channels.

In accordance with predetermined print data, the controller closes, for example, the switch 62*a* so that a voltage is applied between the internal negative electrode layers 42 and internal positive electrode layers 44*a* of the actuator portion 46*a*, resulting in a bias electric field developing in the piezoelectric ceramic layers 40 between these internal electrode layers. Dimensional distortion caused by piezoelectric and electrostrictive longitudinal-effects lengthen the actuator portion 46*a* in the vertical direction of FIG. 7, thereby reducing the volume in the ink channel 32*a*. An increase in pressure accompanying this volume change ejects ink in the ink channel 32*a* from the orifice 37*a* as a droplet 39. Following this, the switch 62*a* is opened and the application of voltage is cut off, returning the actuator portion to its original form. As the ink channel 32*a* increases in volume, ink is refilled into the ink channel 32*a* from the ink supply device 16 via a separate valve (not shown). To give a further example, if another switch 62*b* is closed, displacement of the actuator portion 46*b* will occur so that ink will be ejected from the ink channel 32*b*. Because the piezoelectric ceramic layers 40 are polarized in the direction in which they are stacked, a large amount of deformation develops in the stacked direction, resulting in highly reliable ink ejection.

Next will be described deformation undergone by the layered-type piezoelectric element 38 in an array direction 31 when a voltage is applied thereto. When a voltage of 25 V is applied to, for example, actuator portion 46*a*, then the overlapping region 46$a_1$ undergoes a significant displacement of 200 nm or more. On the other hand, the piezoelectric inactive section 48 hardly undergoes displacement at all. Further, displacement at the overlapping region 46$a_1$ pulls the non-overlapping regions 46$a_2$, creating some displacement there also. Because the ink channels 32*a*, 32*b*, and 32*c* are formed longer in the lengthwise direction than the actuator portions 46*a*, 46*b*, and 46*c*, the actuator portion 46*a* can efficiently deform into corresponding ink channel 32*a*. Consequently, droplet 39 can be effectively ejected using a low driving voltage of only 30 V.

In the piezoelectric-type ink jet printer 15 of the present embodiment, a single layered-type piezoelectric element 38 serves as piezoelectric actuators for all the ejection devices 70*a*, 70*b*, and 70*c*. Therefore, a plurality of arrays 30 assembled together can provide an ink jet print head 15 with a simple configuration that can be produced using simple methods. Therefore, the number and complexity of manufacturing processes can be reduced so that production costs can be reduced. In addition, because the piezoelectric actuators are layered-type piezoelectric elements 38 and because the ink channels 32*a*, 32*b*, and 32*c* are formed longer in the lengthwise direction than corresponding actuator portions 46*a*, 46*b*, and 46*c*, consequently, the actuator portions 46*a*, 46*b*, and 46*c* can effectively and easily deform into corresponding ink channels 32*a*, 32*b*, and 32*c* so that driving voltage can be significantly reduced.

Further, because the internal electrode layers 42, 44 of the layered-type piezoelectric element 38 are formed by screen printing, the electrodes can be simply formed even when the actuator portions 46*a*, 46*b*, and 46*c* and the elongated holes 52 are formed extremely thin. Therefore, an array 30 including the ejection devices 70*a*, 70*b*, and 70*c* can be formed to a small size so that a print head that allows high resolution and a wide printing range can be achieved.

Further, each of the actuator portions 46a, 46b, and 46c divided by the elongated holes 52 are supported connected together at their end portions by the piezoelectric nonactive region 48. Consequently, even when the actuator portions 46a, 46b, and 46c are formed to a narrow width, they will not break or be damaged during production of the print head. Therefore, yield when producing the print head is improved. The actuator portions 46a, 46b, and 46c will also not break when driven, thereby improving reliability of the resultant print head. Also, if the actuator portions 46a, 46b, and 46c can be formed thinner, they can be formed into a more highly integrated unit, which improves print quality of the resultant ink jet print head.

Still further, only the electrode terminal portions 43, 45 of the internal negative electrode layers 42 and internal positive electrode layers 44 of the layered-type piezoelectric element 38 according to the present embodiment are exposed to the exterior. Therefore, deterioration of insulating properties, such as deterioration caused by silver migration, is eliminated. Further, advantages such as superior durability and moisture resistance are gained. Also, because the outer negative electrodes 53 and the outer positive electrodes 54a, 54b, and 54c connected to the internal electrode layers 42, 44a, 44b, and 44c are formed on the same side surface of the layered-type piezoelectric element 38, the electrodes can be easily picked up and collectively electrically connected to a drive control circuit or a circuit substrate for controlling drive of the print head. Also, the outer negative electrodes 53 and the outer positive electrodes 54a, 54b, and 54c can be connected to the electric circuit at a single side surface of the array 30 so that less space is taken up.

While the invention has been described in detail with reference to specific embodiments thereof, it would be apparent to those skilled in the art that various changes and modifications may be made therein without departing from the spirit of the invention, the scope of which is defined by the attached claims.

For example, in the above-described embodiments, one layered-type piezoelectric element 38 serves as piezoelectric actuators for the three ejection devices 70a, 70b, and 70c. However, piezoelectric actuators for additional ejection devices can be formed by adding to, or changing the pattern of, the internal positive electrode layers 44.

Further, in the above embodiment, the internal positive electrode layers 44 are divided in a one-to-one correspondence to the ink channels 32a, 32b, and 32c. However, the internal negative electrode layers 42 may be divided to a one-to-one correspondence to the ink channels 32a, 32b, and 32c. Alternatively, both the internal positive electrode layers 44 and the internal negative electrode layers 42 may be separated in a one-to-one correspondence to the ink channels 32a, 32b, and 32c. That is, it is sufficient for at least one of the internal electrode layers, either positive or negative, to be divided in a one-to-one correspondence to the ink channels 32a, 32b, and 32c.

Also, the array 30 can be provided with more or less than the three ink channels described in the present embodiment.

What is claimed is:

1. A layered-type piezoelectric element for producing a pressure fluctuation within a cavity of an ink jet print head to eject the ink from the cavity, the layered-type piezoelectric element comprising:

piezoelectric ceramic layers; and internal electrode layers stacked in a stacked direction alternately with said piezoelectric ceramic layers to form a stacked body, the internal electrode layers including an odd-numbered electrode layer group and an even-numbered electrode layer group;

wherein elongated holes that are elongated in an elongation direction perpendicular to the stacked direction extend in the stacked direction through a central portion of the stacked body, the elongated holes defining therebetween a plurality of actuator portions that extend in the elongation direction and that are attached at both ends in the elongation direction to other portions of the stacked body, portions of each layer of the odd-numbered electrode layer group being in opposition in the stacked direction with portions of each layer of the even-numbered electrode layer group at least at the actuator portions of the stacked body.

2. A layered-type piezoelectric element as claimed in claim 1, wherein at least one group of the odd-numbered electrode layer group and the even-numbered electrode layer group including a plurality of electrically isolated electrodes disposed at positions corresponding to the actuator portions.

3. A layered-type piezoelectric element as claimed in claim 2, wherein the piezoelectric ceramic layers are polarized in a direction of an electric field produced by application of a voltage between electrode layers.

4. A layered-type piezoelectric element as claimed in claim 2, wherein each electrode layer has a terminal portion, all of the terminal portions being exposed on a same side surface of the stacked body.

5. A layered-type piezoelectric element as claimed in claim 1, wherein layers of the odd-number electrode layer group are disposed in alternation in the stacked direction with layers of the even-number electrode layer group.

* * * * *